United States Patent [19]

Sakaguchi et al.

[11] Patent Number: 5,340,686
[45] Date of Patent: Aug. 23, 1994

[54] POSITIVE-TYPE PHOTORESIST COMPOSITION

[75] Inventors: Shinji Sakaguchi; Shiro Tan; Tadayoshi Kokubo, all of Shizuoka, Japan

[73] Assignee: Fuji Photo Film Co., Ltd., Kanagawa, Japan

[21] Appl. No.: 173,924

[22] Filed: Dec. 28, 1993

Related U.S. Application Data

[63] Continuation of Ser. No. 756,699, Sep. 9, 1991, abandoned.

[30] Foreign Application Priority Data

Sep. 13, 1990 [JP] Japan ................. 2-242973

[51] Int. Cl.$^5$ .................. G03F 7/023; G03F 7/30
[52] U.S. Cl. ...................... 430/191; 430/165; 430/192; 430/193
[58] Field of Search ........... 430/191, 192, 193, 165

[56] References Cited

U.S. PATENT DOCUMENTS

| | | | |
|---|---|---|---|
| 3,928,288 | 12/1975 | Walker | 528/493 |
| 4,267,258 | 5/1981 | Yoneda et al. | 430/325 |
| 4,626,492 | 12/1986 | Eilbeck | 430/192 |
| 4,797,346 | 1/1989 | Yamamoto et al. | 430/192 |
| 4,812,551 | 3/1989 | Oi et al. | 430/192 |
| 4,865,945 | 9/1989 | Noguchi et al. | 430/192 |
| 4,877,859 | 10/1989 | Tamaru et al. | 528/129 |
| 5,019,479 | 5/1991 | Oka et al. | 430/192 |
| 5,023,311 | 6/1991 | Kubota | 430/165 |

FOREIGN PATENT DOCUMENTS 358871 3/1990 Japan ................. 430/191

*Primary Examiner*—Charles L. Bowers, Jr.
*Assistant Examiner*—John S. Chu
*Attorney, Agent, or Firm*—Sughrue, Mion, Zinn, Macpeak & Seas

[57] ABSTRACT

A positive-type photoresist composition is described as including:

(1) an alkali-soluble phenol novolak having a degree of dispersion of from 1.5 to 4.0;
(2) a 1,2-quinone diazide compound; and
(3) from 2 to 30% by weight, based on the above-mentioned novolak, of a low molecular weight compound having a total of from 12 to 50 carbon atoms per molecule and 2 to 8 phenolic hydroxyl groups per molecule. The degree of dispersion is determined from a weight-average molecular weight of the novolak and a number-average molecular weight of the novolak, both the weight-average and number-average molecular weights being obtained by gel penetration chromatography (GPC) defined by using standard polystyrene as a reference, such that the degree of dispersion is a ratio of the weight-average molecular weight to the number average molecular weight.

The positive-type photoresist composition of the present invention is excellent in development latitude and has a high sensitivity and a high resolving power. Thus, it is suitable for use in, for example, the production of semiconductors such as integrated circuits, the production of circuit substrates for thermal heads, and photofabrication processes.

6 Claims, No Drawings

POSITIVE-TYPE PHOTORESIST COMPOSITION

This is a Continuation of application Ser. No. 07/756,699 field Sep. 9, 1991, now abandoned.

FIELD OF THE INVENTION

The present invention relates to a positive-type photoresist composition which comprises a specific alkali-soluble novolak, a 1,2-quinone diazide compound, and a specific low molecular weight component additive, and which is sensitive to radiation such as ultraviolet rays, far ultraviolet rays, X-rays, electron beams, molecular beams, γ-rays, and synchrotron radiation. More particularly, it relates to a positive-type photoresist composition for fine processing which is excellent in development latitude and has a high sensitivity and a high resolving power.

The positive-type photoresist composition of the present invention is suitable for use in, for example, the production of semiconductors such as integrated circuits, the production of circuit substrates for thermal heads and crystal liquids, and other photofabrication processes.

BACKGROUND OF THE INVENTION

As positive-type photoresist compositions, compositions containing an alkali-soluble resin and a naphthoquinone diazide compound as a photosensitive material have been commonly used. For example, U.S. Pat. Nos. 3,666,473, 4,115,128 and 4,173,470 disclose "novolak type phenol resin/naphthoquinone diazide-substituted compounds", while L. F. Thompson, "Introduction to Microlithography" (ACS Press, No. 219, p. 112–121) describes typical examples of "novolak comprising cresol formaldehyde/trihydroxybenzophenone-1,2-naphthoquinonediazide sulfonate".

A novolak is highly useful as a binder, since it is soluble in an alkali aqueous solution without swelling and gives a high resistance against plasma etching when the image thus formed is used as a mask in etching. When used as a photosensitive material, a naphthoquinone diazide compound per se acts as a dissolution inhibitor by lowering the solubility of the novolak in an alkali. When the naphthoquinone diazide compound undergoes decomposition through irradiation, however, it forms an alkali-soluble material and thus elevates the solubility of the novolak in alkali. This remarkable change in the characteristics of the naphthoquinone diazide affected by light makes it particularly useful as a photosensitive material of a positive-type photoresist.

From these points of view, a number of photoresists comprising a novolak and a naphthoquinone diazide photosensitive material have been developed and employed in practice. These photoresists have achieved satisfactory results, so long as the line width of processing is 1 to 2 μm or more.

In recent years, however, the degrees of integration of integrated circuits have become more and more elevated, and the processing of ultra-fine patterns consisting of line widths of 1 μm or below is required in the production of substrate for semiconductor. These fields require the development of a photoresist having a high resolving power, a high accuracy in the reproduction of a pattern form whereby the form of an exposure mask can be exactly copied, and a wide development latitude whereby a constant processing line width can be continuously secured. In order to achieve a high productivity, furthermore, such a photoresist must have a high sensitivity.

It has been considered that a resist having a high value of γ can be advantageously used in order to improve the resolving power so as to achieve a good reproduction of an image. Thus, attempts have been made to develop resist compositions satisfying the above requirement. There have been a number of patents and reports disclosing the aforesaid techniques. With respect to novolaks, which are the major component of positive-type photoresists, there have been a number of patents relating to the monomer compositions, molecular weight distributions, and synthesizing processes thereof. These patents have obtained satisfactory results to a certain degree. However, these photoresists of a high resolving power frequently suffer from the disadvantage of low sensitivity.

On the other hand, it has been suggested to add a low molecular weight compound having an alkali-soluble group as a dissolution accelerator to elevate the sensitivity. However, this method frequently brings about other problems, such as a narrowed development latitude or damaged pattern form.

Accordingly, the development of a resist which has a wide development latitude, a high sensitivity, and a high resolving power is required. The term "development latitude" as used herein may be expressed in the development time dependency or temperature dependency of the line width of the resist obtained after development.

SUMMARY OF THE INVENTION

Therefore, it is an object of the present invention to provide a positive-type photoresist composition which maintains a high resolving power without suffering from any decrease in sensitivity and has a particularly wide development latitude. Other objects of the present invention will be apparent from the detailed description below.

The present inventors have conducted extensive studies directed to the above-mentioned characteristics. As a result, they have found out that the degree of dispersion of a novolak (i.e., the ratio of the weight-average molecular weight ($\overline{M}w$) to the number-average molecular weight ($\overline{M}n$); hereinafter referred to as the degree of dispersion) is an important factor in achieving the objects of the present invention.

Accordingly, the objects of the present invention have been achieved by using a positive-type photoresist composition which comprises:

(1) an alkali-soluble phenol novolak having a degree of dispersion of from 1.5 to 4.0;
(2) a 1,2-quinone diazide compound; and
(3) from 2 to 30% by weight, based on the above-mentioned novolak, of a low molecular weight compound having a total of from 12 to 50 carbon atoms per molecule and 2 to 8 phenolic hydroxyl groups per molecule.

It is to be noted here that the weight-average and number-average molecular weights of the novolak are the values obtained by gel permeation chromatography (GPC) defined by using standard polystyrene as a reference.

DETAILED DESCRIPTION OF THE INVENTION

First, the relation between the present invention and the art will be described.

Controlling the molecular weight distribution of a novolak within a specific range has been known to improve the characteristics of a resist. For example, JP-A-1-105243 discloses that a novolak having a molecular weight distribution wherein the proportion of the molecular chains having the molecular weight of from 500 to 5,000 is 30% or less is preferable (the type "JP-A" as used herein means an "unexamined published Japanese patent application"). Further, JP-A-62-227144 and JP-A-63-2044 each shows that there is a preferred range of the ratio of a specific molecular weight in the molecular weight distribution. Furthermore, JP-A-60-97347 and JP-A-60-189739 each discloses the use a novolak from which low molecular weight components have been removed, while JP-A-60-45238 describes the use of a resin having a degree of dispersion of 3 or below, similar to the one to be used in the present invention but does not disclose the addition of low molecular weight compounds.

The low molecular weight compound having aromatic hydroxyl groups suitable for the present invention is generally employed as a dissolution accelerator in order to, for example, improve sensitivity. A number of examples relating to the addition of these compounds to resist compositions have been disclosed. However, it is commonly observed that the addition of such compounds increases the film loss in the unexposed part, which deteriorates the resist form. It is furthemore observed in general that the elevated development rate deteriorates the development latitude. Therefore, the selection of a compound of a preferable structure whereby the above-mentioned undesirable effects can be minimized has been attempted.

In contrast, the effects of the present invention are specific ones which are never achieved unless the novolak has a specific degree of dispersion and the above-mentioned low molecular weight compound is added thereto.

Namely, the combined use of the above-mentioned low molecular weight compound together with the novolak specified in the present invention elevates the sensitivity of the resist via the dissolution accelerating effect of the low molecular weight compound and provides an unexpectedly wide development latitude, compared with the one obtained by using either one of these components alone.

It has not been clarified yet how these specific effects are achieved. Nevertheless, the high resolving power and the wide development latitude provided by the combined use of the components cannot be achieved by using either one of them alone, nor can these effects be expected from the combined use of the components. Thus, the present invention has been completed based on the finding that the aforesaid specific combination provides these effects.

The present invention will now be described in detail.

The novolak to be used in the composition of the present invention should have a relatively narrow distribution of molecular weight. It has been known that the molecular weight distribution of such a polymer can be expressed by the ratio of the eight-average molecular weight ($\overline{Mw}$) to the number-average molecular weight ($\overline{Mn}$) (i.e., $\overline{Mw}/\overline{Mn}$; identified as the degree of dispersion) of the polisher. A larger ratio means a wider distribution, and the ratio 1 means no distribution. Novolaks used in typical positive-type photoresists have relatively wide molecular weight distributions. For example, many typical novolaks, including those described in JP-A-62-172341, have a degree of dispersion of from 5 to 10. Further, "Advances in Resist Technology and Processing V" (SPIE Proceeding) suggests that a novolak having a degree of dispersion of from 4.55 to 6.75 provides γ-value higher than that of a novolak having a degree of dispersion of 3.0 (vol. 920, page 349).

In contrast to the above-mentioned novolaks, the novolak to be used in the present invention should have a degree of dispersion of from about 1.5 to about 4.0, preferably from about 1.5 to about 3.5, in order to achieve the aforesaid effects. When the degree of dispersion is too large, the wide development latitude (i.e., one of the effects of the present invention) cannot be obtained. When the degree of dispersion is too large, the wide development latitude (i.e., one of the effects of the present invention) cannot be obtained. When the degree of dispersion is too small, purification to a high degree which is scarcely possible in practice is required in the synthesis of the novolak, which makes the embodiment of the process impractical.

The weight-average molecular weight, defined as $\overline{Mw}$, of the novolak of the present invention may preferably range from about 1,000 to about 6,000, more preferably from about 2,000 to about 4,500. When the $\overline{Mw}$ is too large, the effect of the present invention which provides a wide development latitude cannot be achieved, similar to the above case.

Various methods for producing a novolak having a small degree of dispersion as in the present invention may be used. For example, the target novolak may be obtained by selecting a specific phenolic monomer, selecting appropriate condensation reactions, or fractionating a common novolak having a large degree of dispersion by precipitation. Any one of these methods may be selected in order to achieve the effects of the present invention.

The novolak may be obtained by the polycondensation of various phenols, either alone or as a mixture, with the use of an aldehyde such as formalin. Examples of the phenols include phenol, p-cresol, m-cresol, o-cresol,2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis-p-cresol, resorcin, catechol, 2-methylresorcin, 4-methylresorcin, o-chlorophenol, m-chlorophenol, p-chlorophenol, 2,3-dichlorophenol, p-methoxyphenol, m-methoxyphenol, p-butoxyphenol, o-ethylphenol, m-ethylphenol, p-ethylphenol, 2,3-diethylphenol, 2,5-diethylphenol p-isopropylphenol p-tert-butylphenol, α-naphthol, β-naphthol, 4-phenylphenol, and mixtures thereof. Among these materials, it is particularly preferable to use a mixture of alkylphenols, such as cresol, dimethylphenol and trimethylphenol. Furthermore, monomethylol and dimethylol compounds from these phenols may be used as substituted phenols.

In addition to fo,nalin, the following compounds may be used as the aldehydes: p-formaldehyde, acetaldehyde, benzaldehyde, hydroxybenzaldehyde, glyoxal, chloroacetaldehyde, dichloroacetaldehyde, bromoaldehyde, and mixtures thereof.

As the low molecular weight compound having phenolic hydroxyl groups, which is one component in the present invention, compounds having a total of from 12 to 50 carbon atoms and from 2 to 8 phenolic hydroxyl groups may be used. Among these compounds, it is particularly preferable to use a compound which, when added to the novolak, can enhance the dissolution rate of the novolak in alkali. When the number of carbon atoms in the compound is 51 or more, the effects of the present invention are seriously deteriorated. In contrast, when the number of carbon atoms is 11 or less, other problems (for example, the deterioration of heat resistance) might occur. In order to fully achieve the effects of the present invention, the compound should have at least two hydroxyl groups per molecule. When the number of hydroxyl groups is 9 or more, though, the effect of improving the development latitude cannot be achieved. When the number of hydroxyl groups is less than 2, the effects of the present invention can hardly be achieved.

This low molecular weight compound may be added preferably in an amount of from about 2 to about 30% by weight, more preferably from about 5 to about 25% by weight, based on the novolak. When the content of the low molecular weight compound exceeds 30% by weight, a new problem, namely, the deformation of the pattern upon development, occurs. When the content of the low molecular weight compound is less than about 2% by weight, the sensitivity of the resulting photoresist composition is too low and the effects of the present invention cannot sufficiently be achieved.

Any compound may be used as the above-mentioned low molecular weight compound, so long as it satisfies the requirements in structure. However, it is particularly preferable to use a compound having a structure different from that of the low molecular weight component of the novolak per se, such as the novolak represented by the formula (1) as shown, below. For example, novolaks represented by the following formulae (2) to (9) and satisfying the requirements of the present invention may be used as compounds with which the effects of the present invention can be easily achieved. Although compounds of other structures (for example, the compound represented by the formula (1)) may be used in the present invention, the effects which are achieved are inferior to those obtained by using the above-mentioned compounds.

Furthermore, polyhydroxy aromatic compounds suitable as an intermediate material (skeleton) in photosensitive materials, which will be described hereinafter, may be used therefor. In order to fully achieve the effects of the present invention, it is preferable to select a compound having a small ratio of the hydroxyl groups to the total carbon atom number per molecule, not the photosensitive material skeletons to be used in the present invention in practice.

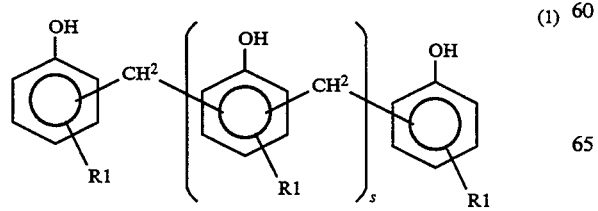
(1)

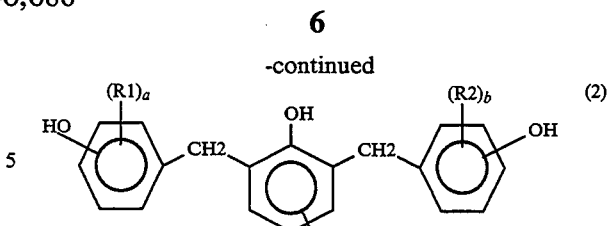
(2)

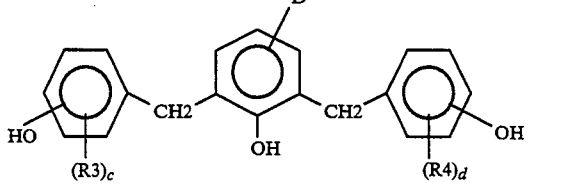
(3)

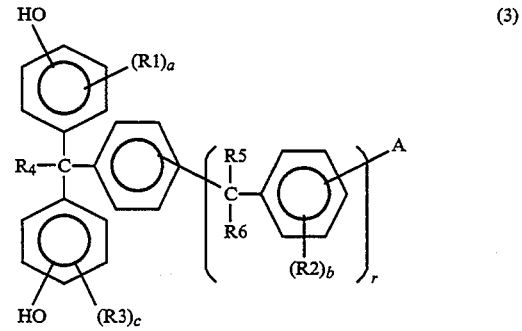
(4)

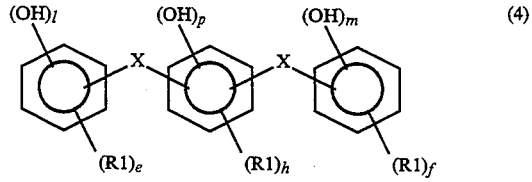
(5)

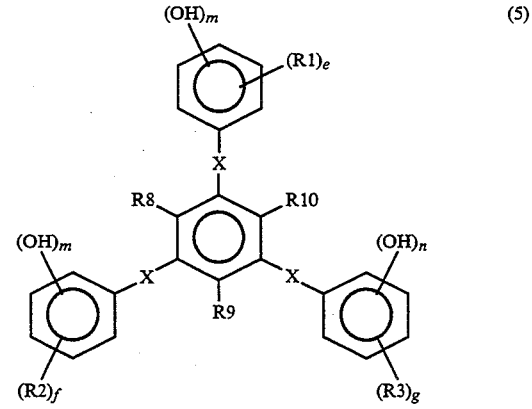
(6)

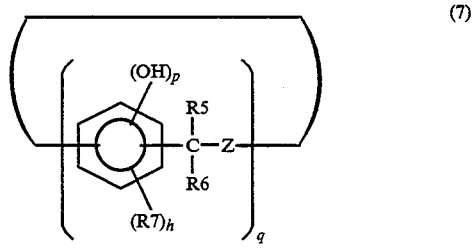
(7)

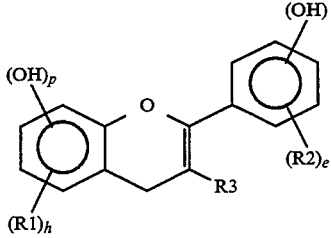

(8)

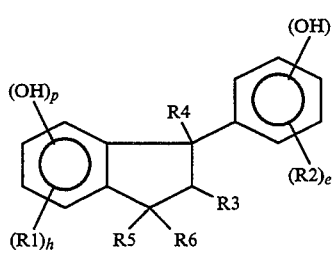

(9)

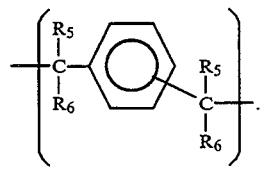

In the above formulae:

$R_1$ to $R_4$ may be either the same or different, and each represents a halogen atom, a lower alkyl group, an alkoxy group, an acyl group, or an acyloxy group;

$R_5$ and $R_6$ may be either the same or different, and each represents a hydrogen atom, a lower alkyl group, or a lower haloalkyl group;

$R_7$ represents a hydrogen atom, a halogen atom, a lower alkyl group, an alkoxy group, an acyl group, or an acyloxy group;

$R_8$ to $R_{10}$ may be either the same or different, and each represents a hydrogen atom, a halogen atom, a hydroxyl group, a lower alkyl group, an alkoxy group, an acyl group, or an acyloxy group;

a to d each represents 0 or an integer of from 1 to 3;
l to n each represents an integer of from 1 to 3;
e to g each represents 0 or an integer of from 1 or 2;
p represents an integer of from 1 to 3;
h represents 0 or an integer of from 1 to (4−p);
q represents an integer of from 3 to 8;
r represents an integer of from 1 to 3;
s represents 0 or an integer of from 1 to 4; and the formula (1) represents a mixture of these compounds;

A represents a hydrogen atom or a hydroxyl group;

X represents a methylene group, a lower alkylsubstituted methylene group, a halomethylene group, or a haloalkylmethylene group;

Y represents a methylene group, a lower alkylsubstituted methylene group, a benzylidene group, a substituted benzylidene group, a straight chain or branched alkylene group, a substituted alkylene group, or a hydroxyalkylene group, all alkylene groups having 2 to 8 carbon atoms; and D represents ,C=O, —S—, ,SO2, —C=$R_1$ a single Z represents a single bond or an oxymethylene group; and D reprsents

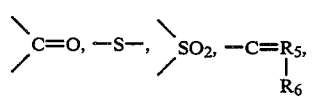

bond, or

As the 1,2-naphthoquinone diazide compound to be used in the present invention, esters of 1,2-naphthoquinone diazide-5- sulfonic acid, 1,2-naphthoquinone diazide-4-sulfonic acid, and 1,2-benzoquinone diazide-4-sulfonic acid with polyhydroxy aromatic compounds may be cited.

Examples of the above-mentioned polyhydroxy aromatic compounds include polyhydroxybenzophenones such as 2,3,4- trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone, and2,3,4,3',4',5'-hexahydroxybenzophenone; polyhydroxyphenyl alkyl ketones such as 2,3,4-trihydroxyacetophenone and 2,3,4-trihydroxyphenyl hexyl ketone; bis[(poly)hydroxyphenyl]alkanes such as bis(2,4-dihydroxyphenyl)methane, bis(2,3,4-trihydroxyphenyl)methane, and bis(2,4-di-hydroxyphenyl)propane-1; polyhydroxybenzoates such as propyl 3,4,5-trihydroxybenzoate and phenyl 3,4,5-trihydroxybenzoate; bis(polyhydroxybenzoyl)alkanes or bis(polyhydroxybenzoyl)aryls such as bis(2,3,4-trihydroxybenzoyl)methane and bis(2,3,4-trihydroxybenzoyl)benzene; alkylene-di(polyhydroxybenzoates) such as ethylene glycol-di(3,5-dihydroxybenzoate); polyhydroxy biphenyls such as 3,5,3',5'-biphenyltetrol, 2,4,2',4'-biphenyltetrol, 2,4,6,3',5'-biphenylpentoland2,4,6,2',4',6'-biphenylhexol; polyhydroxytriphenylmethanes such as 4,4',3'',4''-tetrahydroxy-3,5,3',5'-tetramethyl-triphenylmethane,4,4',2'', 3'',4''-pentahydroxy-3,5,3',5'-tetramethyltriphenylmethane and 2,3,4,2',3',4',3'',4''-octahydroxy-5,5'-diacetyltriphenylmethane; polyhydroxyspirobi-indans such as 3,3,3',3'-tetramethyl-1,1'-spirobi-indan-5,6,5',6'-tetrol, 3,3,3',3'-tetramethyl-1,1'-spirobi-indan-5,6,7,5',6',7'-hexol, 3,3,3',3'-tetramethyl-1,1'-spirobi-indan-4,5,6,4',5',6', hexol and 3,3,3',3'-tetramethyl-1,1'-spirobi-indan-4,5,6,5', 6',7'-hexol; polyhydroxyphthalides such as 3,3-bis(3,4-dihydroxyphenyl)phthalide, 3,3-bis(2,3,4-trihydroxyphenyl)phthalide and 3',4',5',6'-tetrahydroxyspiro-[phthalide-3,9'-xanthene]; polyhydroxybenzopyrans such as 2- (3,4-dihydroxyphenyl) -3,5,7-trihydroxybenzopyran, 2- (3,4,5-trihydroxyphenyl) -3,5-7-trihydroxybenzopyran, 2- (3,4-dihydroxyphenyl) -3-(3,4,5-trihydroxybenzoyloxy ) -5,7-dihydroxybenzopyran and 2- (3,4,5-trihydroxyphenyl) -3-(3,4,5-trihydroxybenzoyloxy) 5,7-dihydroxybenzopyran; polyhydroxyphenylchromans such as 2,4,4-trimethyl-2- (2',4'-dihydroxyphenyl ) -7-hydroxychroman, 2,4,4-trimethyl-2(2',3',4'-trihydroxyphenyl) -7,8-dihydroxychroman and 2,4,4-trimethyl-2-(2',4',6'-trihydroxyphenyl )-5,7-dihydroxychroman; hydroxybenzylphenols such as 2,6-bis(2,3,4-trihydroxybenzyl)-4-methylphenol, 2,6-bis(2,4-dihydroxybenzyl )-4-methylphenol, 2,6-bis(5-chloro-2,4-dihydroxybenzyl)-4-methylphenol, 2,6-bis(2-hydroxybenzyl) -4-methylphenol, 2,6-bis( 2,4,6-trihydroxybenzyl)-4-methylphenol, 2,6-bis(2-acetyl3,4,5-trihydroxybenzyl)-4-methylphenol, 2,4,6-tris(2,3,4-trihydroxybenzyl)phenol, 2,6-bis(3,5-dimethyl-4-hydroxybenzyl)-4-methylphenol, 2,4,6-tris(3,5-dimethyl-4-hydroxybenzyl)-4-methylphenol, 4,6-bis(3,5-dimethyl-4-hydroxybenzyl)pyrogallol, 2,6-bis(3,5-dimethyl-4-hydroxybenzyl)-4-methylphenol and 2,6-bis(3,5-dimethyl-4-hydroxybenzyl)-fluoroglucinol; flavonol coloring matters such as quercetin and rutin; and lower nuclear novolaks, and analogs thereof.

In addition, polymers having aromatic hydroxyl groups (for example, acetone/pyrogallol condensation resin, polyvinylphenol) may be employed in the present invention as a substitute for the low molecular weight compound. It is also possible that an appropriate amount of the hydroxyl groups of the novolak of the present invention per se are substituted with quinone diazide so as to give a product which serves as a photosensitive material and a binder simultaneously. Among these compounds, those wherein at least two aromatic hydroxyl groups are located on a single aromatic ring and a total of at least three hydroxyl groups are present are particularly preferable.

As the photosensitive material, which is a compound obtained by substituting the above-mentioned polyhydroxy compound with at least one 1,2-naphthoquinone diazide group, a mixture of isomers differing from each other in the degree of substitution is generally used. In order to fully achieve the effects of the present invention, however, it is undesirable if the mixture is contaminated with isomers of a low degree of substitution. More particularly, a mixture should be used comprising about 80% by weight or more, more preferably about 90% by weight or more, based on the whole photosensitive material, of an isomer in which all of the hydroxyl groups have been substituted, together with another isomer in which one of the hydroxyl groups remains exclusively in an unsubstituted state.

In the present invention, the photosensitive material may be used in an amount of from about 5 to about 50 parts by weight, preferably from about 10 to about 40 parts by weight, per 100 parts by weight of the alkali-soluble phenolic novolak. When the content of the photosensitive material is smaller than about 5 parts by weight, the retention of the film is seriously lowered. When it exceeds about 50 parts by weight, on the other hand, the sensitivity and the solubility in a solvent deteriorate.

Examples of the solvent in which the photosensitive material and alkali-soluble phenolic novolak of the present invention are to be dissolved include ketones such as methyl ethyl ketone and cyclohexanone; alcohol ethers such as ethylene glycol monomethyl ether and ethylene glycol monoethyl ether; ethers such as dioxane and ethylene glycol dimethyl ether; cellosolve esters such as methyl cellosolve acetate and ethyl cellosolve acetate; fatty acid esters such as butyl acetate, methyl lactate, and ethyl lactate; halogenated hydrocarbons such as 1,1,2-trichloroethylene; and highly polar solvents such as dimethylacetamide, N-methylpyrrolidone, dimethylformamide, and dimethylsulfoxide. Any one of these solvents or a mixture thereof may be used in the present invention.

The positive-type photoresist composition of the present invention may further contain, for example, dyes, plasticizers, adhesion aids, and surfactants, if required. Examples of these additives include dyes such as methyl violet, crystal violet, and malachite green; plasticizers such as stearic acid, acetal resins, phenoxy resins, alkyd resins, and epoxy resins; adhesion aids such as hexamethyldisilazane and chloromethylsilane; and surfactants such as nonylphenoxypoly(ethyleneoxy)ethanol and octylphenoxypoly(ethyleneoxy)ethanol.

In the case of dyes, those having aromatic hydroxyl groups and alkali-soluble groups such as carboxylate groups (for example, curcumin) may be advantageously used in particular. When such a compound is to be added, it is desirable to control the amount of the low molecular weight dissolution accelerator of the present invention so as to obtain the best performance.

The above-mentioned positive-type photoresist composition is applied onto a substrate used for the production of a fine integrated circuit element (for example, a silicon substrate coated with silicon dioxide), glass substrate, ceramics substrate, or metal substrate) by a suitable method (for example, spinning, coating) in such a manner as to give a thickness of from about 0.5 to about 3 µm. Then, the coated substrate is exposed to light via a mask and then developed. Thus, a good resist can be obtained. It is also preferable to lower the surface tension by adding a surfactant containing, for example, a fluorine substituent or a silicon-containing group so as to improve the coating properties.

Examples of the developing solution for the positive-type photoresist composition of the present invention include aqueous solutions of alkalis, including inorganic alkalis such as sodium hydroxide, potassium hydroxide, sodium carbonate, sodium silicate, and sodi, metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide; and tetraethylammoniumhydroxide; and cyclic amines such as pyrrole and piperidine. It is also possible to add an appropriate amount of alcohols, surfactants, and/or aromatic hydroxyl group-containing compounds to the above-mentioned solvents. Among these compounds, it is particularly preferable to use tetraammonium hydroxide.

The positive-type photoresist composition of the present invention is characterized by a high resolving power, a high sensitivity, and a wide development latitude. These characteristics make it highly suitable for the mass-production of semiconductor substrates having fine circuits.

The present invention will now be illustrated in more detail by reference to the following examples. However, the present invention should not be construed as being limited to these examples. All parts, percents, ratios, and the like are by weight, unless stated otherwise.

SYNTHESIS EXAMPLE 1

Methods for synthesizing novolak (b) according to the present invention and novolak (a), employed by way of comparison, will now be described.

(1) Synthesis of novolak (a)

45 g of m-cresol, 55 g of p-cresol, 44.9 g of a 37% aqueous solution of formalin, and 0.05 g of oxalic acid dihydrate were fed into a three-neck flask provided with a stirrer, a reflux condenser and a thermometer. The mixture was heated to 100° C. under stirring and then reacted for 7 hours. After the completion of the reaction, the mixture was cooled to room temperature. Then, the reflux condenser was taken off and the pressure was reduced to 30 mmHg.

Subsequently, the reaction mixture was slowly heated to 150° C., and water and the unreacted monomers were removed. When analyzed by standard polystyrene GPC, the novolak thus obtained showed an $\overline{\text{Mw}}$ of 2,310 and a degree of dispersion of 5.54. This novolak was referred to as the novolak (a).

(2) Synthesis of novolak (b)

54 g of the novolak (a) obtained above was dissolved in 500 ml of MEK. Next, 2,000 ml of cyclohexane was added thereto, and the mixture was heated to 60° C. under stirring. The resulting solution was allowed to stand at room temperature for 16 hours. The precipitate thus formed was then collected, filtered, and dried in a vacuum oven at 50° C. Thus, approximately 18 g of novolak (b) was obtained.

When analyzed by GPC, the novolak (b) showed an $\overline{\text{Mw}}$ of 3,540 and a degree of dispersion of 3.05.

SYNTHESIS EXAMPLE 2

Methods for synthesizing novolaks (c) and (d) according to the present invention and novolak (e), employed by way of comparison, will now be described.

(3) Synthesis of novolak (c)

60 g of m-cresol, 28 g of p-cresol, 31.2 g of 2,6-bishydroxymethyl p-cresol, and 22.4 g of a 37% aqueous solution of formalin were fed into a three-neck flask provided with a stirrer, a reflux condenser, and a thermometer. The mixture was heated in an oil bath at 110° C. under stirring. When the internal temperature reached 90° C., 1.30 g of oxalic acid dihydrate was added thereto. Next, the reaction was continued under reflux for 15 hours, and then the temperature of the oil bath was elevated to 200° C. Then, the reflux condenser was taken off, and the water and the unreacted monomers were removed under reduced pressure. When analyzed by GPC, the novolak thus obtained showed an $\overline{\text{Mw}}$ of 3,560 and a degree of dispersion of 3.75.

(4) Synthesis of novolak (d)

50 g of the novolak (c) obtained above was dissolved in a solvent mixture of 150 g of methanol and 25 g of ethyl cellosolve acetate (ECA) in a 500-ml Kjeldahl flask. When 100 g of pure water was added under stirring, the resulting mixture became cloudy. After the mixture was allowed to stand at room temperature for 30 minutes, the mixture separated into two layers. The upper layer was removed by decantation, and then the solvent was distilled off under reduced pressure. Thus, a solid novolak, which showed an $\overline{\text{Mw}}$ of 4,280 and a degree of dispersion of 3.36, was obtained.

(5) Synthesis of novolak (e)

60 g of m-cresol, 40 g of p-cresol, 15.6 g of 2,6-bishydroxymethyl p-cresol, and 40.7 g of a 37% aqueous solution of formalin were fed into a three-neck flask provided with a stirrer, a reflux condenser, and a thermometer. After 2.60 g of oxalic acid dehydrate was added, the mixture was heated in an oil bath at 110° C. under stirring. After the mixture was allowed to react under reflux for 18 hours, the temperature of the oil bath was elevated to 200° C. Then, the reflux condenser was taken off, and the water and the unreacted monomers were removed under reduced pres sure. When analyzed by GPC, the novolak thus obtained showed an $\overline{\text{Mw}}$ of 6,360 and a degree of dispersion of 4.68.

SYNTHESIS EXAMPLE 3

Methods for synthesizing novolaks (f) and (g) according to the present invention and another novolak (h), employed by way of comparison, will now be described.

(6) Synthesis of novolak (f)

20 g of m-cresol, 30 g of p-cresol, 22.6 g of 2,3-dimethylphenol, and 46.4 g of 2,6-bishydroxymethyl p-cresol were mixed with 500 g of ECA and fed into a three-neck flask provided with a stirrer, a reflux condenser, and a thermometer. After 6.8 g of a 37% aqueous solution of formalin was added, the mixture was heated in an oil bath at 110° C. under stirring. When the internal temperature reached 90° C., 5.4 g of oxalic acid dihydrate was added thereto. Next, the reaction was continued for 18 hours while the temperature of the oil bath was maintained at 110° C. Then, the reaction mixture was cooled and poured into a large amount of water. The novolak thus precipitated was collected and dried. The resulting novolak showed an $\overline{\text{Mw}}$ of 2,320 and a degree of dispersion of 2.05.

(7) Synthesis of novolak (g)

20 g of m-cresol, 45 g of p-cresol, 22.6 g of 2,3-dimethylphenol, and 23.2 g of 2,6-bishydroxymethyl p-cresol were mixed with 150 g of ECA and fed into a three-neck flask provided with a stirrer, a reflux condenser, and a thermometer. After 31.8 g of a 37% aqueous solution of formalin was added, the mixture was heated in an oil bath at 110° C. under stirring. When the internal temperature reached 90° C., 10.2 g of oxalic acid dihydrate was added thereto. Next, the reaction was continued for 18 hours while the temperature of the oil bath was maintained at 110° C. Then, the reaction mixture was cooled and poured into a large amount of water. The novolak thus precipitated was collected and dried. The resulting novolak showed an $\overline{\text{Mw}}$ of 4,720 and a degree of dispersion of 3.32.

(8) Synthesis of novolak (h)

20 g of m-cresol, 55 g of p-cresol, 22.6 g of 2,3-dimethylphenol, and 7.7 g of 2,6-bishydroxymethyl p-cresol were fed into a three-neck flask provided with a stirrer, a reflux condenser, and a thermometer. After 40.6 g of a 37% aqueous solution of formalin was added, the mixture was heated in an oil bath at 110° C. under stirring. When the internal temperature reached 90° C., 2.3 g of oxalic acid dihydrate was added thereto. Next, the reaction was continued for 18 hours while temperature of the oil bath was maintained at 110° C. Then, the reflux condenser was taken off, the unreacted monomers were removed by distilling under reduced pressure at 200° C. After 200 g of ECA was added, the reaction mixture was cooled and poured into a large amount of water. The novolak thus precipitated was collected and dried. The obtained novolak showed an $\overline{\text{Mw}}$ of 8,690 and a degree of dispersion of 6.25.

SYNTHESIS EXAMPLE 4

Methods for synthesizing novolaks (i) and (j) according to the present invention will now be described.

(9) Synthesis of novolak (i)

30 g of p-cresol, 14 g of o-cresol, 50 g of 2,3-dimethylphenol, 20 g of 2,3,5-trimethylphenol, and 4.9 g of 2,6-dimethylphenol were mixed with 50 g of diethylene glycol monomethyl ether and fed into a three-neck flask provided with a stirrer, a reflux condenser, and a thermometer. After 85 g of a 37% aqueous solution of formalin was added, the mixture was heated in an oil bath at 110° C. under stirring. When the internal temperature reached 90° C., 6.2 g of oxalic acid dihydrate was added thereto. Next, the reaction was continued for 18 hours while the temperature of the oil bath was maintained at 130° C. Then, the reflux condenser was taken off, and the unreacted monomers were removed by distilling at 200° C. under reduced pressure. The resulting novolak showed an $\overline{\text{Mw}}$ of 3,230 and a degree of dispersion of 2.75.

(10) Synthesis of novolak (j)

50 g of the novolak (i) obtained above was dissolved in a solvent mixture of 100 g of methanol and 50 g of ECA in a 500-ml Kjeldahl flask. When 50 g of pure water was added under stirring, the mixture became cloudy. After the mixture was allowed to stand at room temperature for 30 minutes, the mixture separated into two layers. The upper layer was removed by decantation, and then the solvent was distilled off under reduced pressure. Thus, a solid novolak, which showed an $\overline{\text{Mw}}$ of 4,320 and a degree of dispersion of 3.68, was obtained.

A method for synthesizing novolak (k) according to the present invention will now be described.

(11) Synthesis of novolak (k)

60 g of m-cresol, 40 g of p-cresol, 48.6 g of a 37% aqueous solution of formalin, and 0.05 g of oxalic acid dihydrate were fed into a three-neck flask provided with a stirrer, a reflux condenser, and a thermometer. The resulting mixture was heated to 100° C. under stirring and then allowed to react for 7 hours. After the completion of the reaction, the mixture was cooled to room temperature. Then, the reflux condenser was taken off, and the pressure was reduced to 30 mmHg.

Next, the mixture was slowly heated to 150° C., and the water and the unreacted monomers were removed. When analyzed by standard polystyrene GPC, the novolak thus obtained showed an $\overline{\text{Mw}}$ of 7,350 and a degree of dispersion of 7.86.

10 g of this novolak was dissolved in 500 ml of THF and charged in a GPC apparatus provided with two preparative GPC columns, TSK-GEL G-2000HG8 and G-4000HG6 (manufactured by Toso Co.). THF was passed at a flow rate of 5 ml/min as an eluent, and thus a fraction of an $\overline{\text{Mw}}$ range of from 6,000 to 8,000 was collected. After removing the solvent, the resulting novolak was referred to as the novolak (k). When analyzed by GPC, the novolak (k) showed an Mw of 7,260 and a degree of dispersion of 2.55.

SYNTHESIS EXAMPLE 6

Methods for synthesizing novolak oligomers (m) and (n), which correspond to the formula (1) to be used as an example of the low molecular weight compound of the present invention, and novolak oligomer (o), which does not fall within the scope of the present invention, will now be described.

(12) Synthesis of novolak oligomer (m)

30 g of m-cresol, 70 g of p-cresol, 41.0 g of a 37% aqueous solution of formalin, and 0.05 g of oxalic acid dihydrate were fed into a three-neck flask provided with a stirrer, a reflux condenser, and a thermometer. The resulting mixture was heated to 100° C. under stirring and then allowed to react for 7 hours. After the completion of the reaction, the mixture was cooled to room temperature. Then, the reflux condenser was taken off, and the pressure was reduced to 30 mmHg.

Next, the mixture was slowly heated to 150° C., and the water and the unreacted monomers were removed. When analyzed by standard polystyrene GPC, the novolak oligomer thus obtained was a mixture comprising 2- to 4-nuclear compounds as the major components.

(13) Synthesis of novolak oligomer (n)

57.7 g of 2,6-bishydroxymethyl p-cresol, 69.5 g of m-cresol, and 0.05 g of oxalic acid dihydrate were fed into a three-neck flask provided with a stirrer, a reflux condenser, and a thermometer. The resulting mixture was heated to 100° C. under stirring and then allowed to react for 7 hours. After the completion of the reaction, the mixture was cooled to room temperature. Then, the reflux condenser was taken off, and the pressure was reduced to 30 mmHg.

Next, the mixture was slowly heated to 150° C., and the water and the unreacted monomers were removed. When analyzed by standard polystyrene GPC, the novolak oligomer thus obtained was a mixture comprising 2- to 6-nuclear compounds as the major components.

(14) Synthesis of novolak oligomer (o)

77.3 g of 2,6-bishydroxymethyl p-cresol, 50 g of m-cresol, and 0.05 g of oxalic acid dihydrate were fed into a three-neck flask provided with a stirrer, a reflux condenser, and a thermometer. The resulting mixture was heated to 100° C. under stirring and then allowed to react for 18 hours. After the completion of the reaction, the mixture was cooled to room temperature. Then, the reflux condenser was taken off, and the pressure was reduced to 30 mmHg.

Next, the mixture was slowly heated to 150° C., and the water and the unreacted monomers were removed. When analyzed by standard polystyrene GPC, the novolak oligomer thus obtained was a mixture comprising 2- to 12-nuclear compounds as the major components (average: 8-nuclear compound, number of carbon atoms=63).

SYNTHESIS EXAMPLE 7

(15) Synthesis of photosensitive material (A)

10 g of 2,3,4,4'-tetrahydroxybenzophenone, 43 g of 1,2- naphthoquinone diazide-5-sulfonyl chloride, and 400 ml of γ-butyrolactone were fed into a three-neck flask and dissolved homogeneously. Next, a mixture of triethylamine and acetone (17 g/40 ml) was slowly added dropwise thereto, and the resulting mixture was allowed to react at 25° C. for 3 hours. Then, the reaction mixture was poured into 1000 ml of a 1% aqueous solution of hydrochloric acid. The precipitate thus formed was filtered, washed with methanol, and dried at 40° C. Thus, a photosensitive material (A) was recovered.

When the product was analyzed by high performance liquid chromatography (HPLC), the peak area ratio detected at 254 nm indicated that it was a mixture comprising 89% of a 4-substituted ester, 5% of a 3-substituted ester, and the balance of other lower substituted esters.

(16) Synthesis of photosensitive material (B)

10 g of 4,4,4',4'-tetramethyl-2,2'-spirobichroman-6,7,6',7'-tetrol, 34.5 g of 1,2-naphthoquinone diazide-5-sulfonyl chloride, and 500 ml of dioxane were fed into a three-neck flask and dissolved homogeneously. Next, a mixture of triethylamine and dioxane (13.7 g/50 ml) was slowly added dropwise thereto, and the resulting mixture was allowed to react at 25° C. for 3 hours. Then, the reaction mixture was poured into 1500 ml of a 1% aqueous solution of hydrochloric acid. The precipitate thus formed was filtered, washed with methanol, and dried at 40° C. Thus, a photosensitive material (B) was recovered.

When the product was analyzed by HPLC in the same manner as described above, it was a mixture comprising 93% of a 4-substituted ester and the balance of other lower substituted esters.

(17) Synthesis of photosensitive material (C)

10 g of 3,3,3',3'-tetramethyl-1,1'-spirobiindan-5,6,7,5',6',7'-hexol, 34.5 g of 1,2-naphthoquinone diazide-5-sulfonyl chloride, and 500 ml of acetone were fed into a threeneck flask and dissolved homogeneously. Next, a mixture of triethylamine and acetone (13.7 g/50 ml) was slowly added dropwise thereto, and the obtained mixture was allowed to react at 25° C. for 3 hours. Then, the reaction mixture was poured into 1500 ml of a 1% aqueous solution of hydrochloric acid. The precipitate thus formed was filtered, washed with methanol, and dried at 40° C. Thus, a photosensitive material (C) was recovered.

When the product was analyzed by HPLC in the same manner as described above, it was a mixture comprising 96% of a 4-substituted ester and the balance of other lower substituted esters.

(18) Synthesis of photosensitive material (D)

10 g of 2,6-bis(3,5-dimethyl-4-hydroxybenzyl) p-cresol, 31.3 g of 1,2-naphthoquinone diazide-5-sulfonyl chloride, and 300 ml of acetone were fed into a three-neck flask and dissolved homogeneously. Next, a mixture of triethylamine and acetone (12.4 g/30 ml) was slowly added dropwise thereto, and the mixture was allowed to react at 25° C. for 15 hours. Then, the reaction mixture was poured into 1,000 ml of a 1% aqueous solution of hydrochloric acid. The precipitate thus formed was filtered, washed with water and methanol, and dried at 40° C. Thus, a photosensitive material (D) was recovered.

When the product was analyzed by HPLC in the same manner as described above, it was a mixture comprising 83% of a 3-substituted ester, 12% of a 2-substituted ester, and the balance of other lower substituted esters.

(19) Synthesis of photosensitive material (E)

10 g of 2,6-bis(3,5-dimethyl-4-hydroxybenzyl)pyrogallol, 31.8 g of 1,2-naphthoquinone diazide-5-sulfonyl chloride, and 300 ml of acetone were fed into a three-neck flask and dissolved homogeneously. Next, a mixture of triethylamine and acetone (12.6 g/30 ml) was slowly added dropwise thereto, and the mixture was allowed to react at 25° C. for 15 hours. Then, the reaction mixture was poured into 1500 ml of a 1% aqueous solution of hydrochloric acid. The precipitate thus formed was filtered, washed with water and methanol, and dried at 40° C. Thus, a photosensitive material (E) was recovered.

When the product was analyzed by HPLC in the same manner as described above, it was a mixture comprising 93% of a 5-substituted ester and the balance of other lower substituted esters.

(20) Synthesis of photosensitive material (F)

10 g of 2,6-bis(2,3,4-trihydroxybenzyl)-p-cresol, 52.4 g of 1,2-naphthoquinone diazide-5-sulfonyl chloride, and 500 ml of γ-butyrolactone were fed into a three-neck flask and dissolved homogeneously. Next, a mixture of triethylamine and acetone (20.7 g/30 ml) was slowly added dropwise thereto, and the mixture was allowed to react at 25° C. for 15 hours. Then, the reaction mixture was poured into 1500 ml of a 1% aqueous solution of hydrochloric acid. The precipitate thus formed was filtered, washed with water and methanol, and dried at 40° C. Thus, a photosensitive material (F) was recovered.

When the product was analyzed by HPLC in the same manner as described above, it was a mixture comprising 48% of a 7-substituted ester, 44% of a 6-substituted ester, and the balance of other lower substituted esters.

(21) Synthesis of photosensitive material (G)

10g of 2,3,4,4'-tetrahydroxybenzophenone, 29.7 g of 1,2- naphthoquinone diazide-5-sulfonyl chloride, and 400 ml of dioxane were fed into a three-neck flask and dissolved homogeneously. Next, a mixture of triethylamine and dioxane (11.8 g/40 ml) was slowly added dropwise thereto, and the mixture was allowed to react at 25° C. for 3 hours. Then, the reaction mixture was poured into 1000 ml of a 1% aqueous solution of hydrochloric acid. The precipitate thus formed was filtered, washed with water, and dried at 40° C. Thus, a photosensitive material (G) was recovered.

When the product was analyzed by HPLC in the same manner as described above, it was a mixture comprising 43% of a 4-substituted ester, 24% of a 3-substituted ester, 12% of a 2-substituted ester, and the balance of other lower substituted esters and unreacted tetrahydroxybenzophenone.

Examples of the resist of the present invention and comparison embodiments, which were prepared by using the novolaks obtained in the above Synthesis Examples together with low molecular weight compounds, will now be given.

The low molecular weight compounds used in these Examples are abbreviated as follows.

Compound 1: a compound of the formula (2), wherein a to d=0 and D=2,2'-isopropylene Compound 2: a compound of the formula (2), wherein a to d=1, $R_1$ to $R_4$=methyl group, and D=2,2'-isopropylene.

Compound 3: a compound of the formula (3), wherein a to c=0, $R_4$ to $R_6$=methyl group, A=hydroxyl group, and r=1

Compound 4: a compound of the formula (4) which is 4,6-bis (3,5-dimethyl-4-hydroxybenzyl)pyrogallol Compound 5: a compound of the formula (4) which is 2,6-bis (2,3,4-trihydroxybenzyl)-p-cresol Compound 6: a compound of the formula (4) which is 2,6-bis (2-hydroxy-5-methylbenzyl) -p-cresol Compound 7: a compound of the formula (4) which is p-cresol dimer Compound 8: a compound of the formula (5 ) which is 2,4,5-tris(3,5-dimethyl-4-hydroxybenzyl) -1,3,5-trihydroxybenzene Compound 9: a compound of the formula (5 ) which is 2,4,5-tris(2-hydroxybenzyl)-1,3,5-trimethoxybenzene Compound 10: a compound of the formula (6) which is 2,4,6,3',5'-pentahydroxybiphenyl Compound 11: a compound of the formula (6) which is bis (3,5-dimethyl-4-hydroxyphenyl) -2,4-dihydroxyphenylmethane Compound 12: a compound of the formula (6) which is nordihydroguaiaretic acid Compound 13: a compound of the formula (7) which is 2,8,14,20-tetramethylpentacyclo-[19.3.1.1$^{3,7}$.1$^{9,13}$.1$^{15,19}$]-octacosa-1(25),3,5,7(28),9,11,13(27),15,17,19(26),21,23- dodecane-4,6,10,12,16,18,22,24-octol Compound 14: a compound of the fo,nula (8) which is 1-(4-hydroxyphenyl) -1,3,3-trimethyl-5,6-dihydroxyindane Compound 15: a compound of the formula (9) which is 2-(3,5-dimethyl-4-hydroxlphenyl)-3,5,7-trihydroxybenzopyran Further, comparison low molecular weight compounds which do not fall within the scope of the present invention are shown below.

Compound 16: phloroglucinol
Compound 17: 4-phenyl phenol
Compound 18: a compound of the formula (2), wherein a to d=1, $R_1$ to $R_4$=isopropyl group, and D=dimethylmethylene group (total nun,ber of carbon atoms=55)
Compound 19: 2,4,6-tris(2,3,4-trihydroxy-5-benzoyl)-1,3,5-trihydroxybenzene (total number of hydroxyl groups=12)
Compound 20: a compound of the formula (6) which is bis(2,3,4-trihydroxy-5-acetylphenyl)-3,4,5-trihydroxyphenylmethane (total number of hydroxyl groups=9)

The sensitivity was defined as the exposure dose required for reproducing a mask pattern of 0.7 μm.

In order to evaluate the development latitude of each sample, the same procedure was repeated except that the development was performed for 20 seconds and 90 seconds. The ratio of the sensitivities, as defined above, in these cases was used as an indicator for the development latitude. A ratio closer to 1 means that the development latitude is wider and more desirable.

The resolving power was defined as the limiting resolving power at the exposure dose for the reproduction of a mask pattern of 0.7 μm.

The heat resistance was defined as the limiting temperature causing no deformation of the pattern of the resist after baking the silicon wafer on a hot plate for 4 minutes.

TABLE 1

Comparison of the Evaluation of Invention Formulations and Comparative Formulations

| Sample | Novolak Resin Kind | Novolak Resin Degree of Dispersion | Low Molecular Weight Compound Kind | Low Molecular Weight Compound Amount (g) | Photosensitive Material Kind | Photosensitive Material Amount (g) | Sensitivity (mJ/cm$^2$) | Resolving Power (μm) | Development Latitude | Heat-Resistance (°C.) |
|---|---|---|---|---|---|---|---|---|---|---|
| Invention 1 | b | 3.05 | Compound-3 | 0.80 | A | 1.10 | 180 | 0.52 | 0.88 | 130 |
| Invention 2 | c | 3.75 | Compound-3 | 0.30 | A | 1.10 | 120 | 0.55 | 0.73 | 120 |
| Invention 3 | d | 3.36 | Compound-3 | 0.50 | A | 1.10 | 200 | 0.50 | 0.79 | 130 |
| Invention 4 | f | 2.05 | Compound-3 | 0.65 | A | 1.10 | 195 | 0.52 | 0.83 | 125 |
| Invention 5 | g | 3.32 | Compound-3 | 0.50 | A | 1.10 | 180 | 0.57 | 0.70 | 130 |
| Invention 6 | i | 2.75 | Compound-3 | 0.50 | A | 1.10 | 185 | 0.50 | 0.91 | 130 |
| Invention 7 | j | 3.68 | Compound-3 | 0.90 | A | 1.10 | 240 | 0.57 | 0.72 | 140 |
| Invention 8 | k | 2.55 | Compound-3 | 0.80 | A | 1.10 | 380 | 0.65 | 0.85 | 150 |
| Comparison 1 | a | 5.54 | Compound-3 | 0.20 | A | 1.10 | 65 | 0.70 | 0.25 | 110 |
| Comparison 2 | b | 3.05 | — | — | A | 1.10 | 320 | 0.60 | 0.65 | 135 |
| Comparison 3 | d | 3.36 | — | — | A | 1.10 | 280 | 0.65 | 0.68 | 135 |
| Comparison 4 | e | 4.68 | Compound-3 | 0.40 | A | 1.10 | 135 | 0.62 | 0.51 | 125 |
| Comparison 5 | f | 2.05 | — | — | A | 1.10 | 305 | 0.60 | 0.62 | 135 |
| Comparison 6 | h | 6.25 | Compound-3 | 0.50 | A | 1.10 | 185 | 0.62 | 0.67 | 125 |
| Comparison 7 | i | 2.75 | — | — | A | 1.10 | 295 | 0.70 | 0.65 | 140 |
| Comparison 8 | e | 4.68 | Compound-3 | 0.20 | A | 1.10 | 200 | 0.62 | 0.58 | 125 |
| Comparison 9 | e | 4.68 | — | — | A | 1.10 | 280 | 0.60 | 0.60 | 130 |

EXAMPLE 1

5 g of each of the novolaks (a) to (k) obtained in the above Synthesis Examples 1 to 5, 1.10 g of the photosensitive material (A) obtained in the above Synthesis Example 7, and the low molecular weight compound 3 in an amount listed in Table 1 were mixed together. The mixtures was dissolved in 18 g of ethyl lactate and filtered through a microfilter (0.2 μm). Thus, a photoresist composition was prepared. The photoresist composition was applied onto a silicon wafer with a spinner and dried on a vacuum adsorption hot plate at 90° C. for 60 seconds. Thus, a resist film of a film thickness of 1.2 μm was obtained. This film was exposed to a reduction projector (EPA-1550M-III, made by Canon) and heated on a vacuum adsorption hot plate at 120° C. for 90 seconds. Then, it was developed with a 2.38% aqueous solution of tetramethylammonium hydroxide for 1 minute, washed with water for 30 seconds, and dried. The silicon wafer resist pattern thus obtained was observed under a scanning electron microscope to thereby evaluate the performance of the resist. Table 1 summarizes the results.

EXAMPLE 2

5 g of each of the novolaks (b), (d) and (i) obtained in the above Synthesis Examples 1, 2, and 4, 1.10 g of each of the photosensitive materials (A) to (G) obtained in the above Synthesis Example 7, and the low molecular weight compound 3 in an amount listed in Table 2 were mixed together. The mixture was dissolved in 18 g of ethyl lactate and filtered through a microfilter (0.2 μm). Thus, a photoresist composition was prepared. The photoresist was evaluated in the same manner as described in Example 1. Table 2 summarizes the results.

EXAMPLE 3

5 g of the novolak (d) obtained in the above Synthesis Example 2, 1.10 g of each of the photosensitive materials (A) to (G) obtained in the above Synthesis Example 7, and each of the low molecular weight compounds 1 to 20 or each of the novolak oligomers (m) to (o) obtained in the above Synthesis Example 6 in an amount listed in Table 3 were mixed together. The mixture was dissolved in 18 g of ethyl lactate and filtered through a microfilter (0.2 μm). Thus, a photoresist composition was prepared. The photoresist was evaluated in the same manner as described in Example 1. Table 3 summarizes the results.

TABLE 2

Comparison of the Evaluation of Invention Formulations and Comparative Formulations

| Sample | Novolak Resin Kind | Novolak Resin Degree of Dispersion | Low Molecular Weight Compound Kind | Low Molecular Weight Compound Amount (g) | Photosensitive Material Kind | Photosensitive Material Amount (g) | Sensitivity (mJ/cm$^2$) | Resolving Power ($\mu$m) | Development Latitude | Heat-Resistance (°C.) |
|---|---|---|---|---|---|---|---|---|---|---|
| Invention 9  | b | 3.05 | Compound-3 | 0.80 | C | 1.10 | 170 | 0.52 | 0.85 | 130 |
| Invention 10 | d | 3.36 | Compound-3 | 0.60 | B | 1.10 | 220 | 0.50 | 0.81 | 135 |
| Invention 11 | d | 3.36 | Compound-3 | 0.40 | C | 1.10 | 185 | 0.52 | 0.79 | 135 |
| Invention 12 | d | 3.36 | Compound-3 | 1.00 | D | 1.10 | 205 | 0.50 | 0.75 | 130 |
| Invention 13 | d | 3.36 | Compound-3 | 0.75 | E | 1.10 | 200 | 0.52 | 0.82 | 130 |
| Invention 14 | d | 3.36 | Compound-3 | 0.50 | F | 1.10 | 170 | 0.50 | 0.85 | 130 |
| Invention 15 | d | 3.36 | Compound-3 | 0.25 | G | 1.10 | 150 | 0.57 | 0.65 | 130 |
| Invention 16 | i | 2.75 | Compound-3 | 0.35 | C | 1.10 | 165 | 0.52 | 0.83 | 135 |
| Invention 17 | i | 2.75 | Compound-3 | 1.35 | D | 1.10 | 180 | 0.55 | 0.73 | 125 |
| Invention 18 | i | 2.75 | Compound 3 | 1.00 | D | 1.10 | 225 | 0.52 | 0.80 | 125 |
| Invention 19 | i | 2.75 | Compound-3 | 0.30 | G | 1.10 | 140 | 0.60 | 0.59 | 130 |
| Comparison 10 | d | 3.36 | — | — | C | 1.10 | 295 | 0.57 | 0.62 | 130 |
| Comparison 11 | d | 3.36 | — | — | G | 1.10 | 205 | 0.55 | 0.70 | 130 |
| Comparison 12 | e | 4.68 | Compound-3 | 0.40 | C | 1.10 | 120 | 0.62 | 0.49 | 130 |
| Comparison 13 | i | 2.75 | — | — | C | 1.10 | 280 | 0.70 | 0.63 | 140 |
| Comparison 14 | d | 3.36 | Compound-3 | 1.55 | A | 1.10 | measurement impossible (pattern varies) | | | |
| Comparison 15 | i | 2.75 | Compound-3 | 1.55 | C | 1.10 | measurement impossible (pattern varies) | | | |

TABLE 3

Comparison of the Evaluation of Invention Formulations and Comparative Formulations

| Sample | Novolak Resin | Low Molecular Weight Compound Kind | Low Molecular Weight Compound Amount (g) | Photosensitive Materials Kind | Photosensitive Materials Amount (g) | Sensitivity (mJ/cm$^2$) | Resolving Power ($\mu$m) | Development Latitude | Heat-Resistance (°C.) |
|---|---|---|---|---|---|---|---|---|---|
| Invention 20 | d | Compound-1  | 0.40 | A | 1.10 | 160 | 0.55 | 0.75 | 135 |
| Invention 21 | d | Compound-2  | 0.60 | C | 1.10 | 180 | 0.52 | 0.81 | 135 |
| Invention 22 | d | Compound-3  | 0.70 | A | 1.10 | 175 | 0.50 | 0.79 | 130 |
| Invention 23 | d | Compound-4  | 0.30 | A | 1.10 | 165 | 0.52 | 0.77 | 130 |
| Invention 24 | d | Compound-5  | 0.30 | A | 1.10 | 180 | 0.50 | 0.82 | 130 |
| Invention 25 | d | Compound-6  | 0.40 | E | 1.10 | 220 | 0.47 | 0.85 | 130 |
| Invention 26 | d | Compound-7  | 0.50 | F | 1.10 | 145 | 0.57 | 0.75 | 125 |
| Invention 27 | d | Compound-8  | 0.25 | C | 1.10 | 160 | 0.55 | 0.78 | 130 |
| Invention 28 | d | Compound-9  | 0.50 | C | 1.10 | 205 | 0.52 | 0.80 | 130 |
| Invention 29 | d | Compound-10 | 0.35 | C | 1.10 | 135 | 0.60 | 0.65 | 125 |
| Invention 30 | d | Compound-11 | 0.50 | A | 1.10 | 160 | 0.55 | 0.73 | 130 |
| Invention 31 | d | Compound-12 | 0.65 | F | 1.10 | 175 | 0.52 | 0.77 | 130 |
| Invention 32 | d | Compound-13 | 0.50 | F | 1.10 | 155 | 0.52 | 0.75 | 130 |
| Invention 33 | d | Compound-14 | 0.75 | A | 1.10 | 185 | 0.50 | 0.78 | 130 |
| Invention 34 | d | Compound-15 | 0.60 | D | 1.10 | 160 | 0.55 | 0.74 | 130 |
| Invention 35 | d | Compound-4  | 0.30 | E | 1.10 | 160 | 0.62 | 0.65 | 130 |
| Invention 36 | d | Compound-13 | 0.50 | D | 1.10 | 175 | 0.60 | 0.63 | 130 |
| Invention 37 | d | Oligomer m  | 0.30 | C | 1.10 | 165 | 0.57 | 0.70 | 130 |
| Invention 38 | d | Oligomer n  | 0.45 | C | 1.10 | 170 | 0.57 | 0.68 | 130 |
| Comparison 16 | d | Compound-16 | 0.40 | C | 1.10 | 120 | 0.70 | 0.50 | 110 |
| Comparison 17 | d | Compound-17 | 0.50 | C | 1.10 | 150 | 0.65 | 0.56 | 120 |
| Comparison 18 | d | Compound-18 | 0.65 | C | 1.10 | 270 | 0.62 | 0.65 | 135 |
| Comparison 19 | d | Compound-19 | 0.30 | C | 1.10 | 135 | 0.67 | 0.47 | 125 |
| Comparison 20 | d | Compound-20 | 0.50 | C | 1.10 | 155 | 0.65 | 0.52 | 130 |
| Comparison 21 | d | Oligomer o  | 0.70 | C | 1.10 | 220 | 0.62 | 0.66 | 135 |

As described above, every resist sample satisfying the requirements of the present invention showed a high resolving power without suffering from any substantial decrease in sensitivity and was excellent in development latitude, in contrast to the comparative samples.

While the invention has been described in detail and with reference to specific embodiments thereof, it will be apparent to one skilled in the art that various changes and modifications can be made therein without departing from the spirit and scope thereof.

What is claimed is:

1. A positive-type photoresist composition comprising in admixture:

(1) an alkali-soluble phenol novolak having a degree of dispersion of from 1.5 to 4.0 and a $\overline{\text{Mw}}$ of from 2,000 to 6,000;

(2) a 1,2-quinone diazide compound; and (3) from 2 to 30% by weight, based on said novolak, of a low molecular weight compound having a total of from 12 to 50 carbon atoms per molecule and form 2 to 8 phenolic hydroxyl groups per molecule;

wherein the alkali-soluble phenol novolak is prepared by copolymerization of an aldehyde with a phenol mixture comprising at least two alkyl phenols containing substantially not less than 80% of phenol monomers selected from the group consisting of cresol, dimethylphenol, trimethylphenol and methoxyphenol;

wherein said degree of dispersion is determined from a weight-average molecular weight of said novolak and a number-average molecular weight of said novolak, both said weight-average and number-average molecular weights being obtained by gel permeation chromatography (GPC) defined by using standard polystyrene as a reference, such that said degree of disperison is a ratio of said weight-average molecular weight to said number-average molecular weight;

wherein said 1,2-quinone diazide compound is present in an amount of from 5 to 50 parts by weight per 100 parts by weight of said novolak; and wherein said low molecular weight compound is represented by any of formulae (L-1) to (L-8):

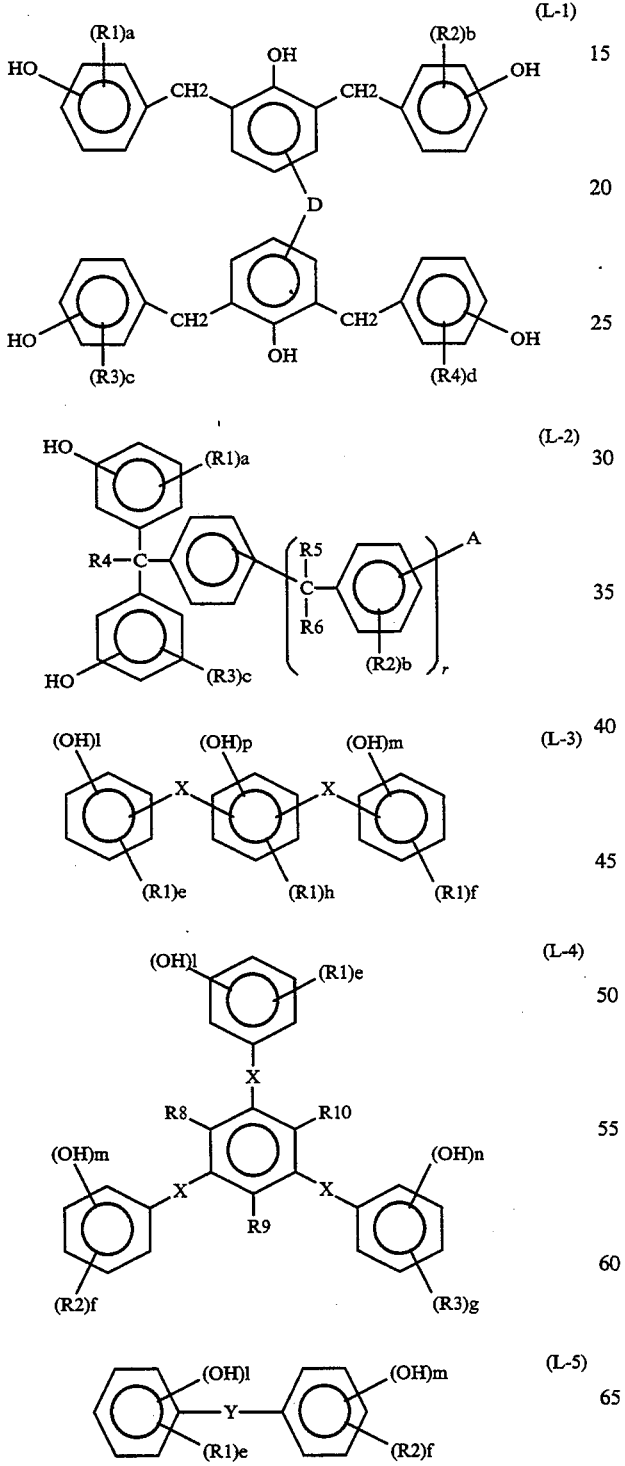

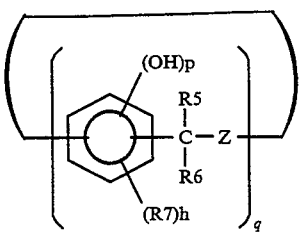

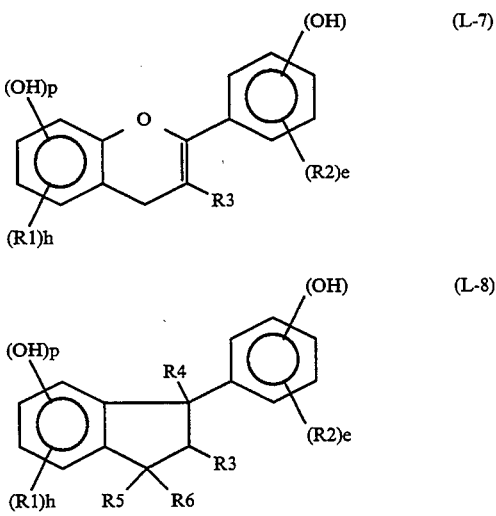

wherein $R_1$ to $R_4$ may be either the same or different, and each represents a halogen atom, a lower alkyl group, an alkoxy group, an acyl group, or an acyloxy group;

$R_5$ and $R_6$ may be either the same or different, and each represents a hydrogen atom, a lower alkyl group, or a lower haloalkyl group;

$R_7$ represents a hydrogen atom, a halogen atom, a lower alkyl group, an alkoxy group, an acyl group, or an acyloxy group;

$R_8$ to $R_{10}$ may be either the same or different, and each represents a hydrogen atom, a halogen atom, a hydroxyl group, a lower alkyl group, an alkoxy group, an acyl group, or an acyloxy group;

a to d each represents 0 or an integer of from 1 to 3;

e to g each represents 0 or an integer of from 1 to 2;

l to n each represents an integer of from 1 to 3;

p represents an integer of from 1 to 3;

h represents 0 or an integer of from 1 to (4−p);

q represents an integer of from 3 to 8;

r represents an integer of from 1 to 3;

s represents 0 or an integer of from 1 to 4;

A represents a hydrogen atom or a hydroxyl group;

X represents a methylene group, a lower alkyl-substituted methylene group, a halomethylene group, or a haloalkylmethylene group;

Y represents a methylene group, a lower alkyl-substituted methylene group, a benzylidene group, a substituted benzylidene group, a straight chain or branched alkylene group, a substituted alkylene group, or a hydroxyalkylene group, all alkylene groups having 2 to 8 carbon atoms;

Z represents a single bond or an oxymethylene group; and D represents C=O, —S—, SO₂,

a single bond, or

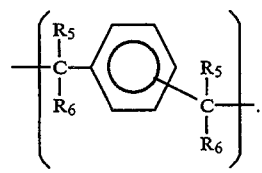

2. A positive-type photoresist composition as in claim 1, wherein said degree of dispersion is form 1.5 to 3.5.

3. A positive-type photoresist composition as in claim 1, wherein said novolak has a weight-average molecular weight of from 2,000 to 4,500.

4. A positive-type photoresist composition as in claim 1, wherein said low molecular weight compound is present in an amount of from 5 to 25% by weight, based on said novolak.

5. A positive-type photoresist composition as in claim 1, wherein said 1,2-quinone diazide compound is present in an amount of from 10 to 40 parts by weight per 100 parts by weight of said novolak.

6. A positive-type photoresist composition as in claim 1, wherein said low molecular weight compound is represented by either of formulae (L-1) and (L-2).

* * * * *